United States Patent
Jeong et al.

(10) Patent No.: US 7,357,645 B2
(45) Date of Patent: Apr. 15, 2008

(54) PLASMA DISPLAY DEVICE WITH GROUNDING MODULE

(75) Inventors: Jae-Seok Jeong, Suwon-si (KR); Tae-Kyoung Kang, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/329,231

(22) Filed: Jan. 11, 2006

(65) Prior Publication Data
US 2006/0154498 A1 Jul. 13, 2006

(30) Foreign Application Priority Data
Jan. 12, 2005 (KR) ............. 10-2005-0002817

(51) Int. Cl.
*H01R 12/00* (2006.01)
(52) U.S. Cl. ................................. 439/66
(58) Field of Classification Search ........... 439/66, 439/92, 95, 67, 567; 174/138 G, 72 A; 361/809–810, 361/804, 825–827
See application file for complete search history.

(56) References Cited

U.S. PATENT DOCUMENTS

| | | | |
|---|---|---|---|
| 6,019,614 A | 2/2000 | Baur et al. | |
| 6,493,233 B1 | 12/2002 | De Lorenzo et al. | |
| 6,799,980 B2 * | 10/2004 | Bloomfield et al. | 439/92 |
| 6,924,437 B1 * | 8/2005 | Creekmore et al. | 174/138 G |
| 2005/0079748 A1 * | 4/2005 | Kim | 439/92 |

FOREIGN PATENT DOCUMENTS

| | | |
|---|---|---|
| JP | 2004-158777 | 6/2004 |
| KR | 20-1991-0005252 | 3/1991 |
| KR | 10-2003-0016498 | 3/2003 |

* cited by examiner

*Primary Examiner*—J. F. Duverne
(74) *Attorney, Agent, or Firm*—Lee & Morse, P.C.

(57) ABSTRACT

A plasma display device includes a plasma display panel mounted on a first side of a chassis base, a mount on a second side of the chassis base, the mount being electrically connected to the chassis base, a printed circuit board including an electrical grounding section and having an opening in the electrical grounding section, the printed circuit board mounted on the mount by an electrically conductive fastener passing through the opening in the electrical grounding section, and a grounding module positioned in the opening so as to be between the electrical grounding section and the electrically conductive fastener and electrically connecting the electrical grounding section to the mount.

21 Claims, 11 Drawing Sheets

PLASMA DISPLAY DEVICE WITH GROUNDING MODULE

BACKGROUND OF THE INVENTION

1. Field of the Invention

The present invention relates to a plasma display device. More particularly, the present invention relates to a plasma display device having a simplified chassis base structure and a grounding module for enhancing grounding of a printed circuit board assembly.

2. Description of the Related Art

A plasma display device is an apparatus that displays an image from a plasma display panel (PDP) using plasma generated by a gas discharge. Typically, the plasma display device includes the PDP, a chassis base supporting the PDP, and a plurality of printed circuit board assemblies (PBAs) mounted to the chassis base on a side opposite of the PDP. The PBAs may be connected to display electrodes or address electrodes via, e.g., flexible printed circuits (FPCs) and connectors.

A typical PDP includes two glass substrates attached to each other at peripheral regions of their surfaces with a discharge space formed therebetween. Generally, the PDP exhibits weak mechanical strength and is susceptible to damage from physical impact. PDPs also produce substantial amounts of heat during operation and can suffer from excessive heat buildup. To address this heat buildup problem, a thermal conduction sheet may be provided along the rear side of the PDP to conduct and channel the heat produced by the PDP away from the PDP by spreading and dissipating the heat in planar directions.

The chassis base is generally formed of a metallic material having sufficient mechanical strength to support the PDP, and the PDP is attached to one side of the chassis base using, e.g., a double-sided adhesive tape disposed along the peripheral edges of the PDP. The chassis base performs several functions, including providing physical reinforcement to the PDP, supporting the PBAs, dissipating heat generated by the PDP, preventing electromagnetic interference (EMI), providing a ground structure, etc. The chassis base may be provided with separate reinforcement for enhancing its strength. In order to mount the PBAs, the chassis base may be provided with a plurality of bosses. The bosses are grounded such that EMI produced by the PBAs may be reduced. The PBAs may be mounted and fastened onto the bosses provided on the chassis base using, e.g., fasteners.

Typically, the PBAs are provided with a circular grounding area, e.g., a hole, at the fastening portion of the PBA. The PBAs are grounded through this grounding section such that the EMI may be reduced. The grounding section is typically a circular penetration hole of the PBAs. As the PBAs may include a plurality of layers, e.g., insulating and conducting layers, the grounding section may pass through a number of layers. Further, the grounding section may be in contact with one or more layers.

The PBAs are placed on the bosses such that the grounding sections of the PBAs are placed on bosses after which fasteners are used to fasten the PBAs to the bosses using the circular penetration holes in the PBAs and fastening holes, e.g., threaded holes, in the bosses.

In order to ensure that the PBAs remain in place on the bosses, and in order to ensure satisfactory electrical connections between the grounding section of the PBAs and the bosses, the fasteners, e.g., fasteners, may need to be installed under significant tension. That is, the fasteners may need to be torqued to a predetermined value in order to ensure application of sufficient compressive force to maintain the physical and electrical connection between the PBAs and the bosses. However, the fastening force from the fasteners may cause distortion of the grounding sections of the PBAs, particularly those having a multi-layer structure.

In particular, the construction and materials of the PBAs is not optimal with respect to the amount of compressive force that can be applied thereto. As a result, torquing the fasteners to the predetermined torque may cause an inelastic deformation of the PBAs in the grounding section, permanently distorting them. Such distortion of the grounding section may cause a thermal distortion of the PBA as a result of the heat produced during an operation of the PDP, thereby causing fasteners to become unfastened from the fastening hole over time. Further, the inelastic deformation of the PBAs may result in insufficient tension on the fasteners, thereby causing the fasteners to become unfastened. As a result, the grounding of the PBA may deteriorate, and, accordingly, the EMI may be increased.

The information provided above sets forth an overview of the problems that the present invention is designed to overcome. However, the information does not constitute prior art.

SUMMARY OF THE INVENTION

The present invention is therefore directed to a plasma display device having a simplified chassis base structure and enhanced grounding of a PBA, which substantially overcomes one or more of the problems due to the limitations and disadvantages of the related art.

It is feature of an embodiment of the present invention to provide a plasma display device that combines a chassis base structure with enhanced grounding of a PBA.

It is another feature of an embodiment of the present invention to provide a plasma display device whereby mounting and grounding of PBAs is simplified.

It is yet another feature of an embodiment of the present invention to provide a plasma display device whereby grounding of PBAs is not degraded by loosened fasteners.

At least one of the above and other features and advantages of the present invention may be realized by providing a plasma display device including a plasma display panel mounted on a first side of a chassis base, a mount on a second side of the chassis base, the mount being electrically connected to the chassis base, a printed circuit board including an electrical grounding section and having an opening in the electrical grounding section, the printed circuit board mounted on the mount by an electrically conductive fastener passing through the opening in the electrical grounding section, and a grounding module positioned in the opening so as to be between the electrical grounding section and the electrically conductive fastener and electrically connecting the electrical grounding section to the mount.

The grounding module may be in contact with the mount through the opening. The mount may be a reinforcing member of the chassis base. The grounding module may include a plate having a flange, and the flange may be mounted through the opening. The printed circuit board may further include a plurality of apertures adjacent the opening, and the grounding module may further include a plurality of protrusions disposed at an angle to the plate and correspondingly engaged with the plurality of apertures. At least one of the plurality of protrusions may contact the mount through its corresponding aperture.

The plasma display device may further include a second grounding module positioned in the opening so as to be between the printed circuit board and the mount, wherein the second grounding module includes a second plate having a second flange, and the second flange is mounted through the opening. The flange and the second flange may be in contact through the opening. The printed circuit board may further include a plurality of apertures adjacent the opening, and each of the plate and the second plate may further include respective pluralities of protrusions disposed at an angle to the respective plates and correspondingly engaged with the plurality of apertures. At least one of the plurality of protrusions of the plate and at least one of the plurality of protrusions of the second plate may be in contact through a corresponding aperture of the plurality of apertures.

The grounding module may further include a second plate and a connecting member, the plate and the second plate may be linked by the connecting member, and the plate may be positioned on one side of the printed circuit board and the second plate is positioned on an opposite side of the printed circuit board. The flange and the second plate may be in contact through the opening.

The grounding module may further include a second plate, and the plate and the second plate may be formed at opposite ends of the flange and are disposed on opposite sides of the printed circuit board. The plate and the second plate may be circular. The grounding module may be formed by providing a grounding module blank in the opening, the grounding module blank including the circular plate and a cylindrical member, and deforming an end of the cylindrical member to form the second plate. The grounding module may be formed by coating a conductive material on opposite sides of the printed circuit board and in the opening. A main component of the conductive material may be nickel. The conductive material may be a solder paste. The printed circuit board may further include a plurality of apertures adjacent the opening, forming the grounding module may further include coating the conductive material in the plurality of apertures, and the plate and the second plate may be joined by the flange and by a plurality of members formed by the conductive material in the plurality of apertures.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 10-2005-0002817, filed on Jan. 12, 2005, in the Korean Intellectual Property Office, and entitled "Plasma Display Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
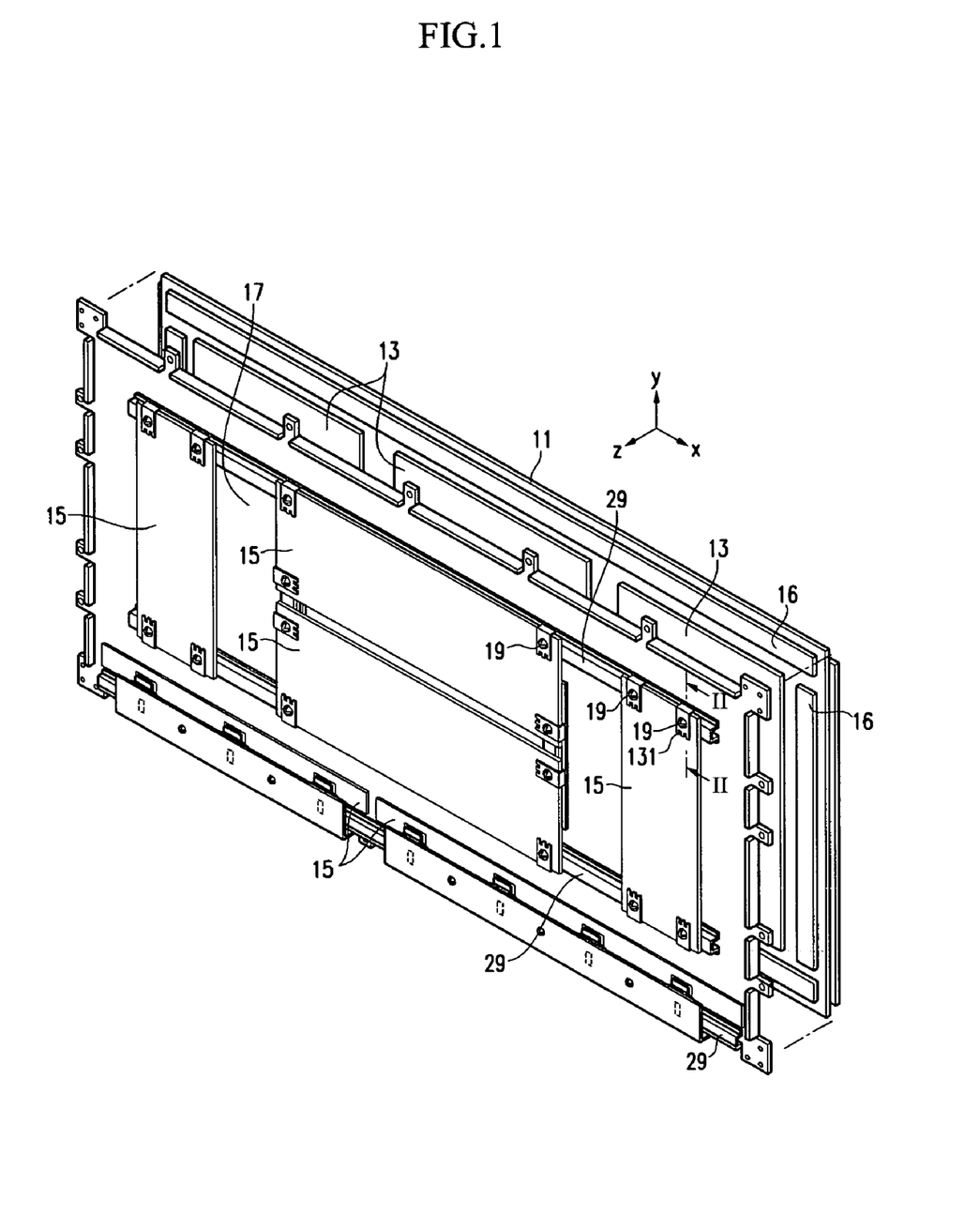
FIG. 1 illustrates an exploded, perspective view of a plasma display device according to an embodiment of the present invention.
Figure 2:
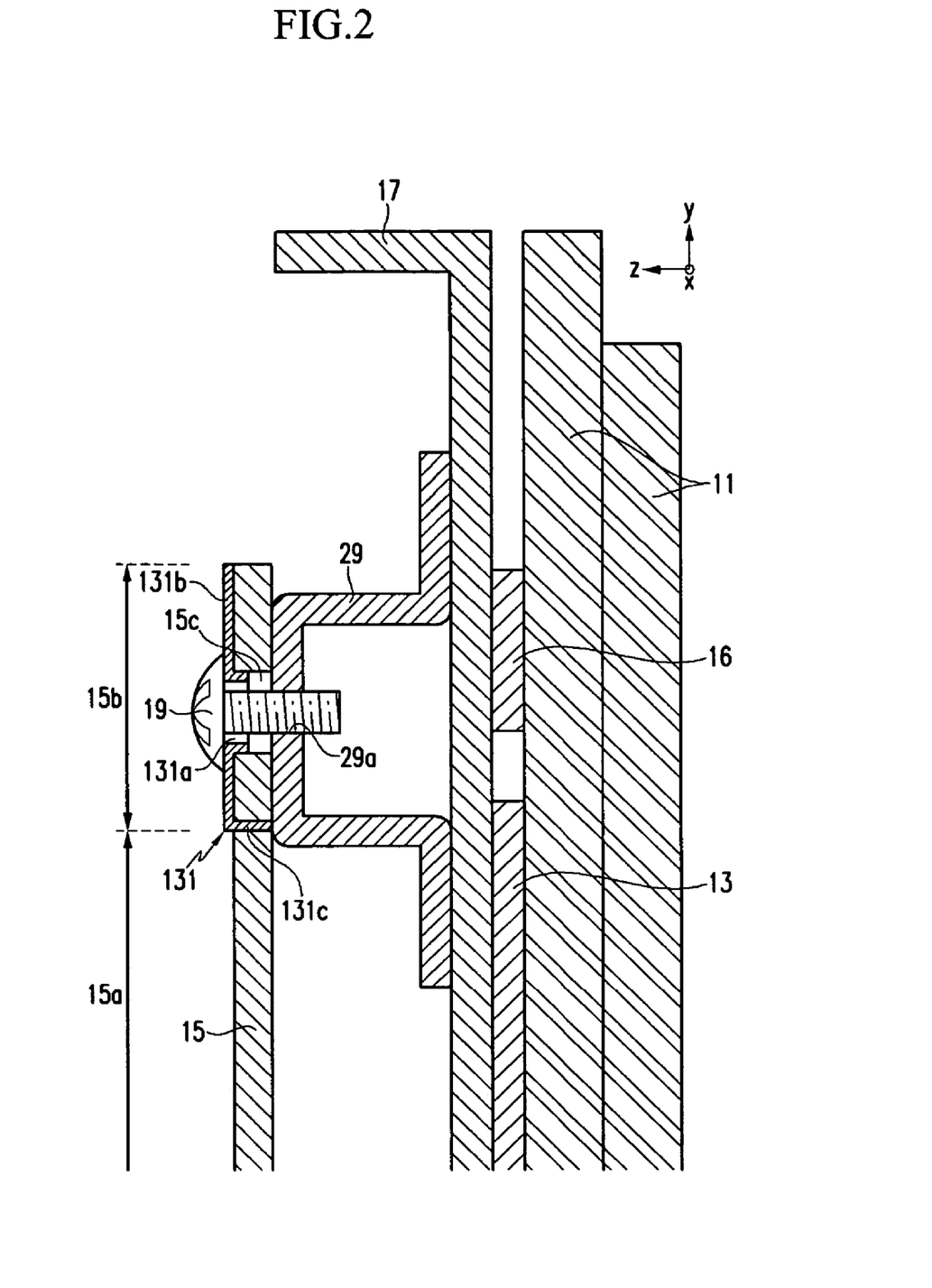
FIG. 2 illustrates a partial, sectional view of the plasma display device illustrated in FIG. 1, taken along line II-II of FIG. 1.

FIG. 1 illustrates an exploded, perspective view of a plasma display device according to an embodiment of the present invention, and FIG. 2 illustrates a partial, sectional view of the plasma display device illustrated in FIG. 1, taken along line II-II of FIG. 1. Referring to FIGS. 1 and 2, a plasma display device in accordance with the present invention includes a PDP 11 for displaying an image using gas discharge, heat dissipation sheets 13, printed circuit board assemblies (PBAs) 15 electrically connected to the PDP 11 to drive the PDP, and a chassis base 17 mounted with and supporting on its front side the PDP 11 via a double-sided adhesive tape 16 and mounted with and supporting at its rear side the PBAs 15. An embodiment of the present invention is primarily focused on the relation of the PDP 11 and other structural elements and their configuration relative to the plasma display device as a whole, and accordingly, the PDP 11 will not be described in further detail.

Heat dissipation sheets 13 may be attached to the rear of the PDP 11 so as to conduct and dissipate heat generated by the gas discharge of the PDP 11 in planar directions (i.e., directions on the x-y plane as illustrated in FIG. 1). The heat dissipation sheet 13 may be made of a heat dissipation material that exhibits thermal conductivity, such as acryl, graphite, metal, or carbon nanotubes.

Although multiple PBAs are introduced in various embodiments of the present invention, hereinafter they will be collectively or respectively referred to using the same reference numeral 15. PBAs 15 may be mounted to a side of the chassis base 17 opposite the side on which the PDP 11 is mounted. The PBAs 15 may be mounted by one or more fasteners 19, which may be conductive and may be, e.g., setscrews, bolts, etc.

Among the PBAs 15, there may be an image processing/controlling board that may receive a video signal from an exterior source, generate control signals for driving address electrodes (not shown) and display electrodes (not shown), and respectively apply these control signals to an address buffer board, a scan driving board, and a sustain driving board. Also among the PBAs 15, there may be a power supply board for supplying electric power required for driving the plasma display device. For driving the PDP 11, the address buffer board, the scan driving board and the sustain driving board are respectively connected with address electrodes, scan electrodes, and sustain electrodes of the PDP 11, for example, through respective FPCs (not shown). They may also be connected with the power supply board through, for example, a flexible flat cable (FFC).

The PBAs 15 may be electrically coupled with the PDP 11 in such a manner that they respectively include a circuit portion 15a and a grounding section 15b (as illustrated in FIG. 2). A fastening hole 15c may be formed in the grounding section 15b for mounting the PBAs 15 to the chassis base 17 using, e.g., fasteners 19. The PBAs 15 may be fastened to the chassis base 17 by fastening the fasteners 19 to the chassis base 17 through fastening holes 15c while, at the same time, the grounding sections 15b of each PBA 15 are grounded to the chassis base 17.

The PBAs 15 may be mounted to a side of the chassis base 17 opposite a side on which the PDP 11 is mounted, and the chassis base 17 may be provided with reinforcing members 29 to enhance its mechanical strength. The chassis base 17 may be formed by pressing a thin plate of a metallic material, and in this case the chassis base 17 is required to show sufficient mechanical strength against twisting and bending forces. For that purpose, the chassis base 17 may preferably be bent at its ends to form an L-shaped cross-section The chassis base 17 may be provided with a reinforcing member 29 having bent ends as illustrated in the drawings.

The reinforcing member 29 may enhance the strength of the chassis base 17 and enable mounting of the PBAs to the rear side of the chassis base. In this respect, the reinforcing members 29 may be formed to be able to mount the PBAs 15 and more than one may be provided for mounting the PBAs 15.

The reinforcing member 29 may be used solely to increase the strength of the chassis base 17, and the PBAs 15 may be mounted to the chassis base 17 through separate bosses (not shown) provided on the chassis base 17. In such an instance, the reinforcing member 29 may be of a material selected solely for strength enhancement of the chassis base 17. However, if a reinforcing member 29 is positioned at a location where a PBA 15 is mounted or attached to the chassis base 17, then the reinforcing member 29 may also be used for mounting the PBAs 15 without using bosses. Thus, in addition to increasing the strength of the chassis base 17, the use of the reinforcing member 29 to mount the PBAs may provide a simple and efficient structure. This is illustrated in FIG. 1, wherein the reinforcing member 29 is used for both enhancing the strength of the chassis base 17 and mounting the PBAs 15. Accordingly, the reinforcing member 29 may be provided with one or more threaded holes 29a in correspondence with the fastening hole 15c of respective PBAs 15, for engaging the fastener 19.

Figure 3:
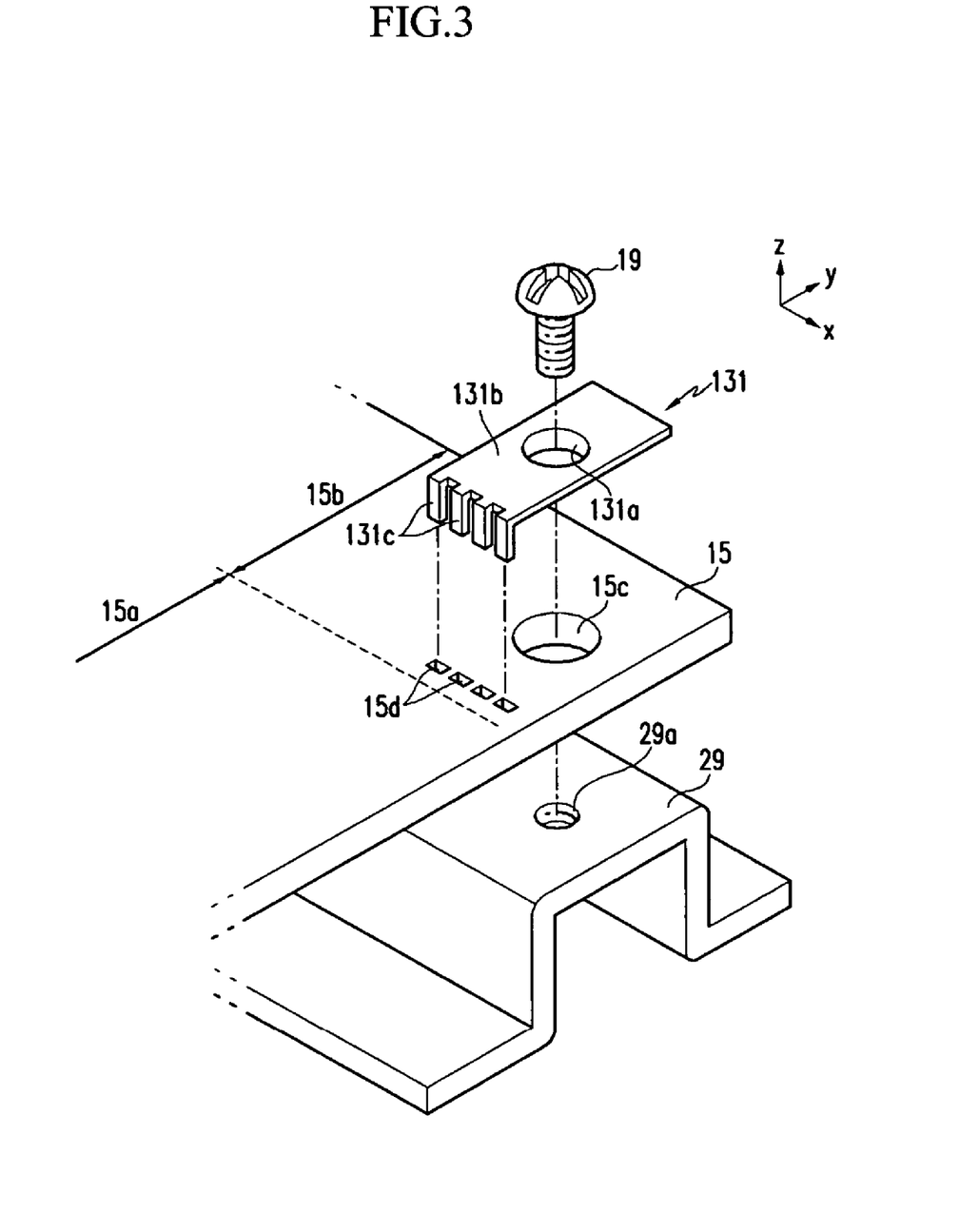
FIG. 3 illustrates an exploded, perspective view of a chassis base, a reinforcing member, a PBA, and a first embodiment of a grounding module illustrated in FIG. 2.

FIG. 3 illustrates an exploded, perspective view of a chassis base, a reinforcing member, a PBA, and a first embodiment of a grounding module illustrated in FIG. 2. As described above, the plasma display device may be additionally provided with a grounding module 131, which will now be described in greater detail. Referring to FIG. 3, the grounding module 131 may serve to ground the grounding section 15b of the PBAs 15 to, e.g., the reinforcing member 29 on the chassis base 17. The grounding module 131 may be formed of a conductive material.

The grounding module 131 may be disposed among the reinforcing member 29, the PBA 15, and the fastener 19 (refer to FIG. 2). In particular, the grounding module 131 may be disposed between the PBA 15 and the fastener 19, e.g., disposed against a surface of the PBA 15 at the grounding section 15b. The grounding module 131 may be formed so as to surround the fastening hole 15c, including the area adjacent the fastening hole 15c, as well as to occupy the interior wall of the fastening hole 15c. The grounding module 131 (and consequently the grounding section 15b of the PBA 15) may be in contact and may be grounded to the reinforcing member 29 by the fastening force of the fastener 19, which may be fastened to the threaded hole 29a of the reinforcing member 29 through the fastening hole 15c.

The grounding module 131 may be formed in various structures. For example, a plurality of apertures 15d, e.g., receiving holes, may be formed in the grounding section 15b of the PBA 15. The grounding module 131 may have a plurality of corresponding protrusions 131c that may be engaged with, e.g., tightly inserted in, the apertures 15d.

In a first embodiment of the present invention, the grounding module 131 may include a circular flange 131a for insertion into and contact with the interior wall of the fastening hole 15c, and a base plate 131b formed around the circular flange 131a for contacting the grounding section 15b. The flange 131a may maintain the position of the grounding module 131 at the grounding section 15b by being inserted into and in contact with the fastening hole 15c. The base plate 131b may provide surface contact with the grounding section 15b and with the fastener 19, such that the grounding of the grounding section 15b to the reinforcing member 29 may be enhanced due to the electrical conductivity of the fastener 19.

The grounding module 131 may include protrusions 131c, which may be formed by, e.g., bending an end of the base plate 131b, to be inserted into the apertures 15d. The protrusions 131c may be inserted into the apertures 15d to contact the grounding section 15b. The grounding section 15b may be electrically coupled to the circuit portion 15a and may have a multi-layer structure to increase the integrity and reliability of the ground formed with the grounding module 131. In addition, as illustrated in FIG. 2, an end of the protrusion 131c may directly contact the reinforcing member 29, whereby the integrity and reliability of the grounding may be increased and further enhanced.

Various other embodiments of the grounding module 131 will now be described in detail. The second to fifth embodiments of the grounding module may be similar to the first exemplary embodiment of the grounding module in general scheme and operation. Accordingly, in the description of the second to fifth embodiments, the focus and description will primarily be on differences and variations from the first embodiment of the grounding module 131.

The grounding module 131 may be provided to only one side of the grounding section 15*b* of the PBA 15 as in the first embodiment, and it may also be provided to both sides of the grounding section 15*b* of the PBA 15 as will be described in connection with other embodiments. When the grounding module is provided on both sides of the grounding section 15*b*, both grounding modules may be electrically connected so as to be simultaneously grounded to the reinforcing member 29, thereby further increasing the integrity and further ensuring the reliability of the grounding.

SECOND EMBODIMENT

Figure 4:
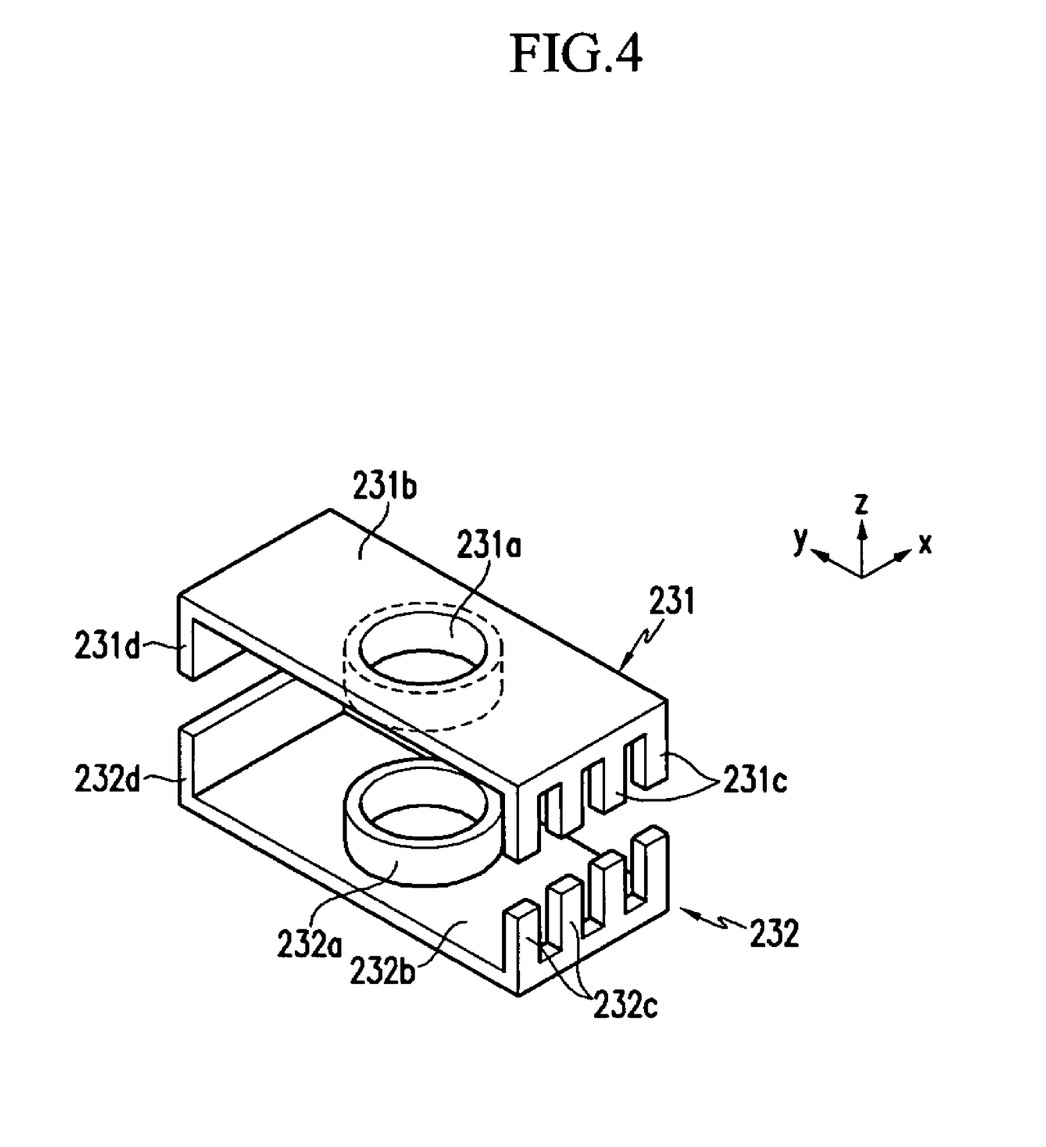
FIG. 4 illustrates a perspective view of a second embodiment of a grounding module according to the present invention.
Figure 5:
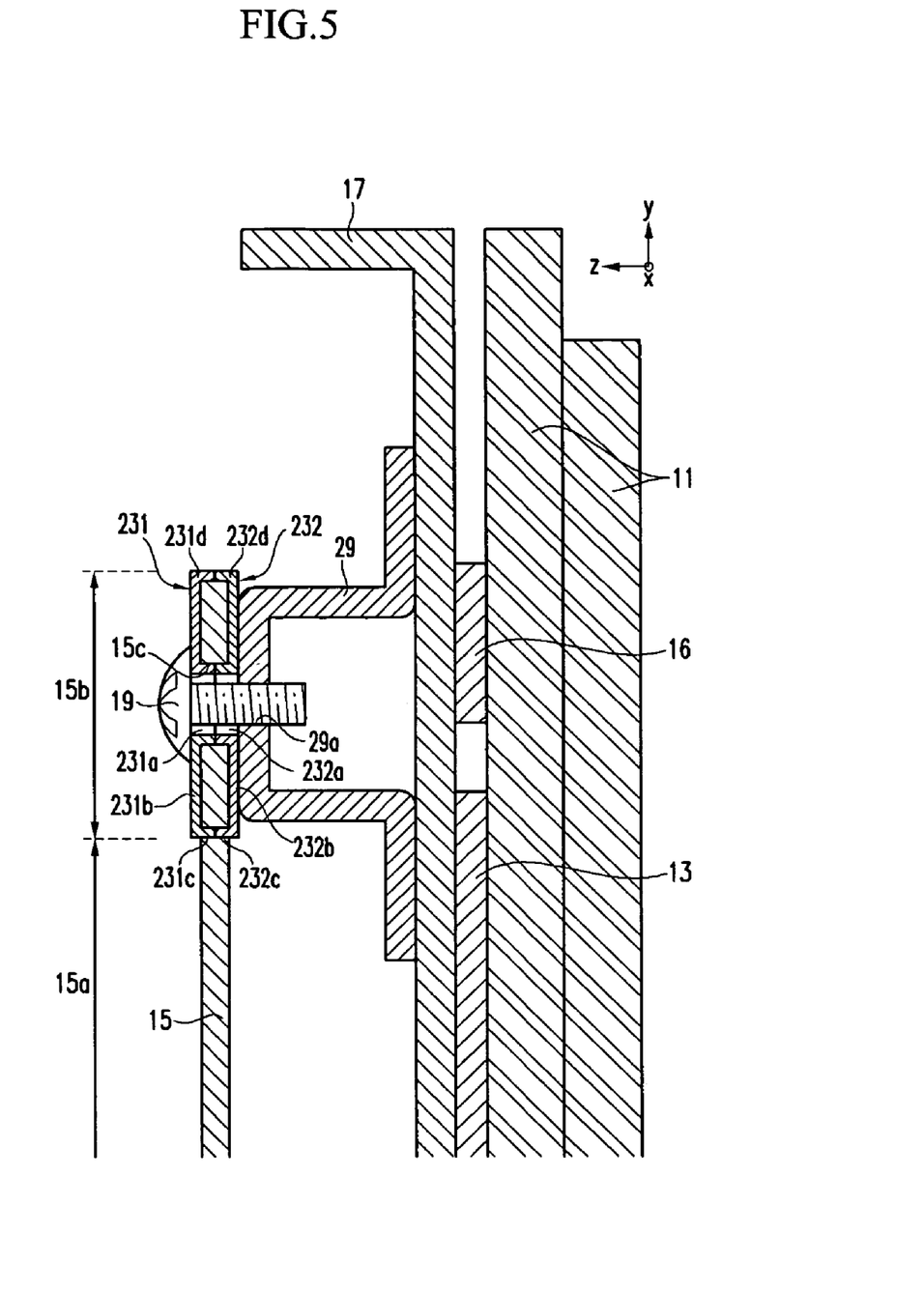
FIG. 5 illustrates a partial, sectional view of a plasma display device including the grounding module illustrated in FIG. 4, taken along a line corresponding to line II-II of FIG. 1.

FIG. 4 illustrates a perspective view of a second embodiment of a grounding module according to the present invention, and FIG. 5 illustrates a partial, sectional view of a plasma display device including the grounding module illustrated in FIG. 4, taken along a line corresponding to line II-II of FIG. 1. Referring to FIGS. 4 and 5, in accordance with a second embodiment of the grounding module 131 of the present invention, a pair of first and second grounding modules 231 and 232 may be provided. The first grounding module 231 may be provided for the fastening hole 15*c* on one side of the grounding section 15*b* of the PBA 15. The second grounding module 232 may be provided for the fastening hole 15*c* on the other side of the grounding section 15*b* of the PBA 15.

The first and second grounding modules 231 and 232 may be disposed symmetrically, and on both sides of the grounding section 15*b* of the PBA 15. The first and second grounding modules 231 and 232 may be in physical and electrical contact through the fastening hole 15*c*. That is, they may contact each other at some point in the fastening hole 15*c*. Fastener 19 may be engaged with threaded hole 29*a* of reinforcing member 29 to hold and ground the grounding section 15*b* of the PBA 15, which may be fitted with the grounding modules 231 and 232, to reinforcing member 29. The grounding modules 231 and 232 may increase the integrity and reliability of the grounding while also protecting the PBA 15 from the fastening force of the fastener 19 and preventing distortion of the grounding section 15*b* of the PBA 15. That is, since the first and second grounding modules 231 and 232 may be in physical contact through the fastening hole 15*c*, the force of the fastener 19 may be transferred from the first grounding module 231 directly to the second grounding module 232 and the reinforcing member 29, thus reducing or eliminating the compressive forces on the PBA 15 that can deform the PBA 15.

The first grounding module 231 may include a first circular flange 231*a* inserted into the fastening hole 15*c*, a first base plate 231*b* planarly formed around the first circular flange 231*a* and electrically contacting the grounding section 15*b*. The first grounding module 231 may also include first protrusions 231*c* formed by, e.g., bending an end of the first base plate 231*b* so as to be inserted into the apertures 15*d*. Similarly, the second grounding module 232 may include a second circular flange 232*a* inserted into the fastening hole 15*c* and electrically contacting the first circular flange 231*a*, a second base plate 232*b* planarly formed around the second circular flange 232*a* and electrically contacting the grounding section 15*b*, and second protrusions 232*c* formed by, e.g., bending an end of the second base plate 232*b* so as to be inserted into the apertures 15*d*. The second protrusions 232*c* may physically electrically contact the first protrusions 231*c* through a corresponding plurality of apertures (not shown in FIGS. 4 and 5).

The first and second grounding modules 231 and 232 may be substantially the same as the grounding module 131 of the first exemplary embodiment. Additionally, the grounding modules 231 and 232 may further include lateral portions 231*d* and 232*d*, respectively, as illustrated in FIG. 4. As illustrated in FIG. 5, the lateral portions 231*d* and 232*d* may contact each other, both physically and electrically, when assembled on the grounding section 15*b* of PBA 15.

THIRD EMBODIMENT

Figure 6:
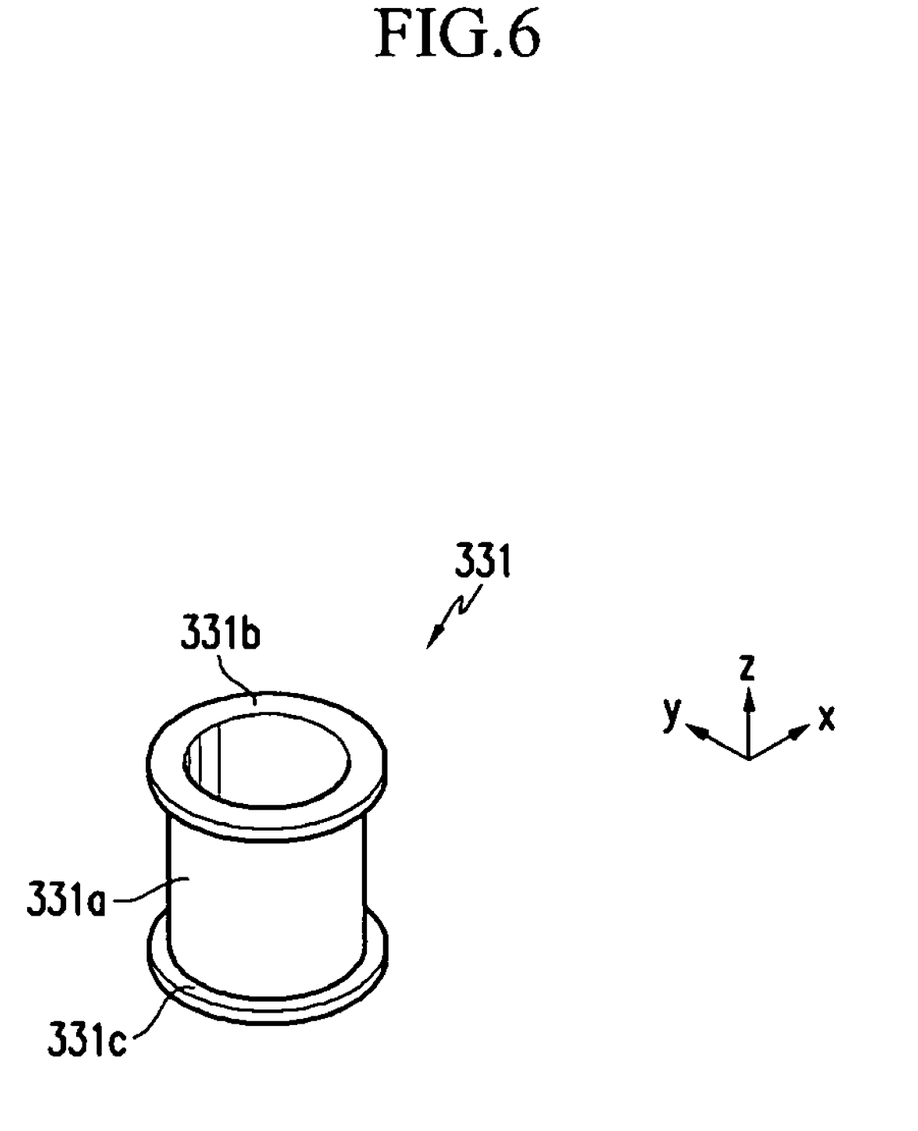
FIG. 6 illustrates a perspective view of a third embodiment of a grounding module according to the present invention.
Figure 7:
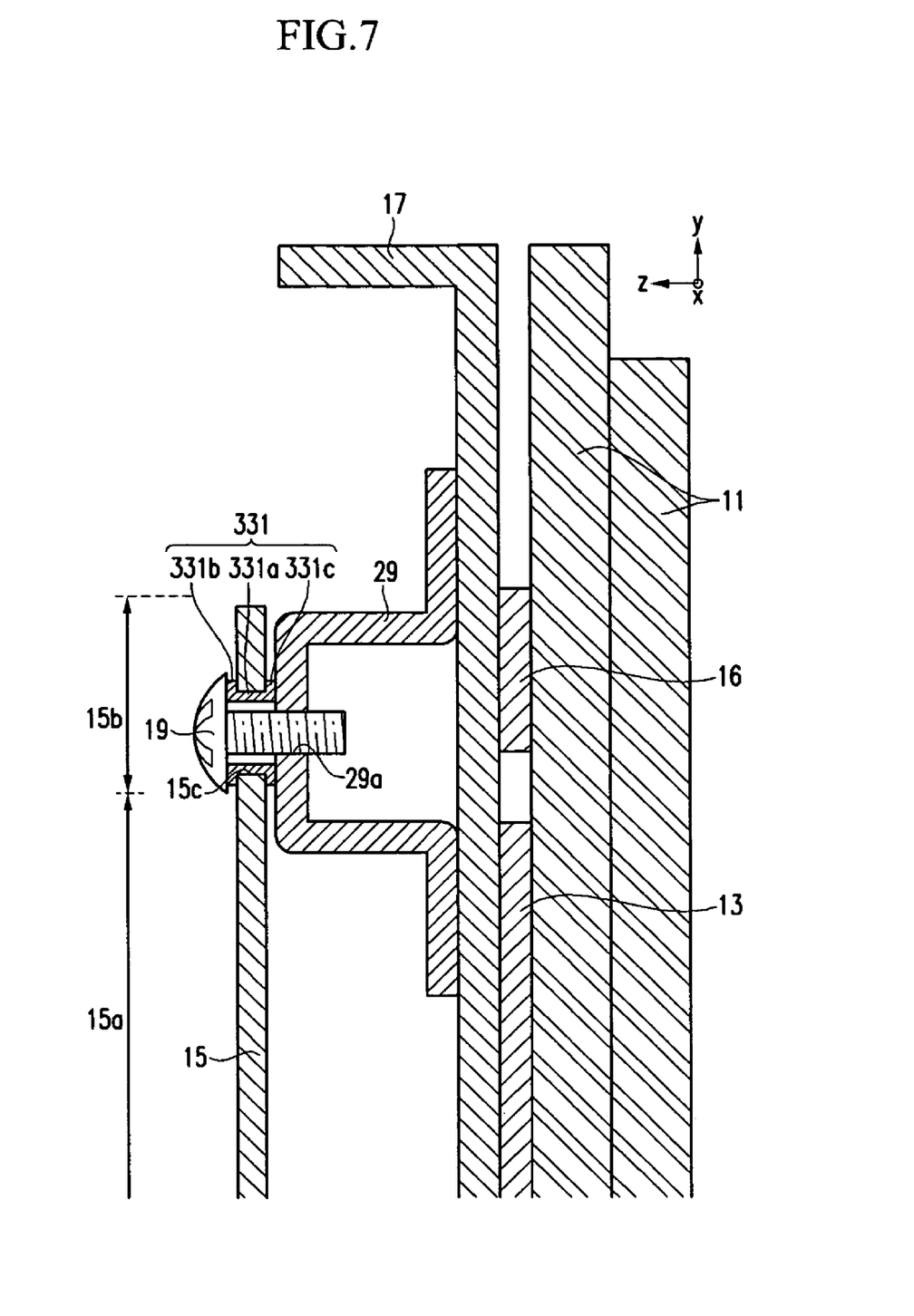
FIG. 7 illustrates a partial, sectional view of a plasma display device including the grounding module illustrated in FIG. 6, taken along a line corresponding to line II-II of FIG. 1.

FIG. 6 illustrates a perspective view of a third embodiment of a grounding module according to the present invention, and FIG. 7 illustrates a partial, sectional view of a plasma display device including the grounding module illustrated in FIG. 6, taken along a line corresponding to line II-II of FIG. 1. Referring to FIGS. 6 and 7, a grounding module 331 according to a third embodiment may include a cylinder 331*a* and flanges 331*b* and 331*c*. The cylinder 331*a* may be inserted into the fastening hole 15*c*. The flanges 331*b* and 331*c* may formed by bending opposite ends of the cylinder 331*a* in a radial direction such that the flanges 331*b* and 331*c* make electrical contact with the grounding section 15*b* around the peripheral area of the fastening hole 15*c* on both sides of the grounding section 15*b* of PBA 15. Alternatively, the grounding module 331 may include the cylinder 331*a* and only one of the two flanges 331*b* and 331*c* (not shown).

The flanges 331*b* and 331*c* provided on opposing ends of the cylinder 331*a* may be symmetrically formed. The grounding module 331 may be formed by, e.g., providing a grounding module blank having the flange 331*b* with a cylindrical member extending therefrom, disposing the grounding module blank so that the cylindrical member passes through the fastening hole 15*c*, and deforming an end of the cylindrical member to form the flange 331*c*. The flanges 331*b* and 331*c* may make electrical contact with the grounding section 15*b* on both sides of the PBA 15, e.g., a multi-layer PBA, via cylinder 331*a*. The fastener 19 may penetrate or pass through the cylinder 331*a* to be engaged with threaded hole 29*a* of reinforcing member 29. The grounding section 15*b* of the PBA 15 may thereby be grounded to the reinforcing member 29, whereby the integrity and reliability of the grounding may be increased and further enhanced while the grounding section 15*b* is protected from distortion.

FOURTH EMBODIMENT

Figure 8:
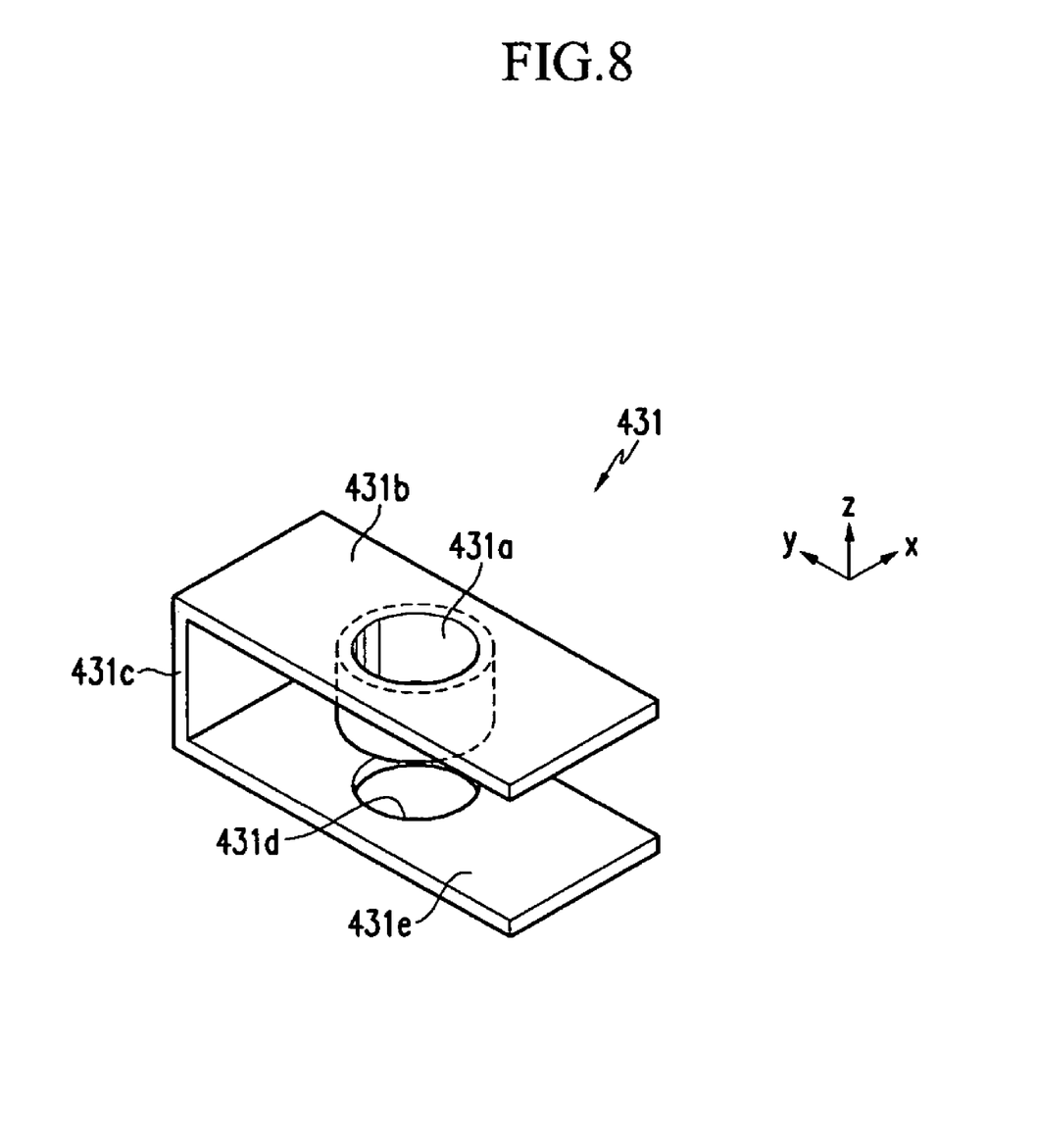
FIG. 8 illustrates a perspective view of a fourth embodiment of a grounding module according to the present invention.
Figure 9:
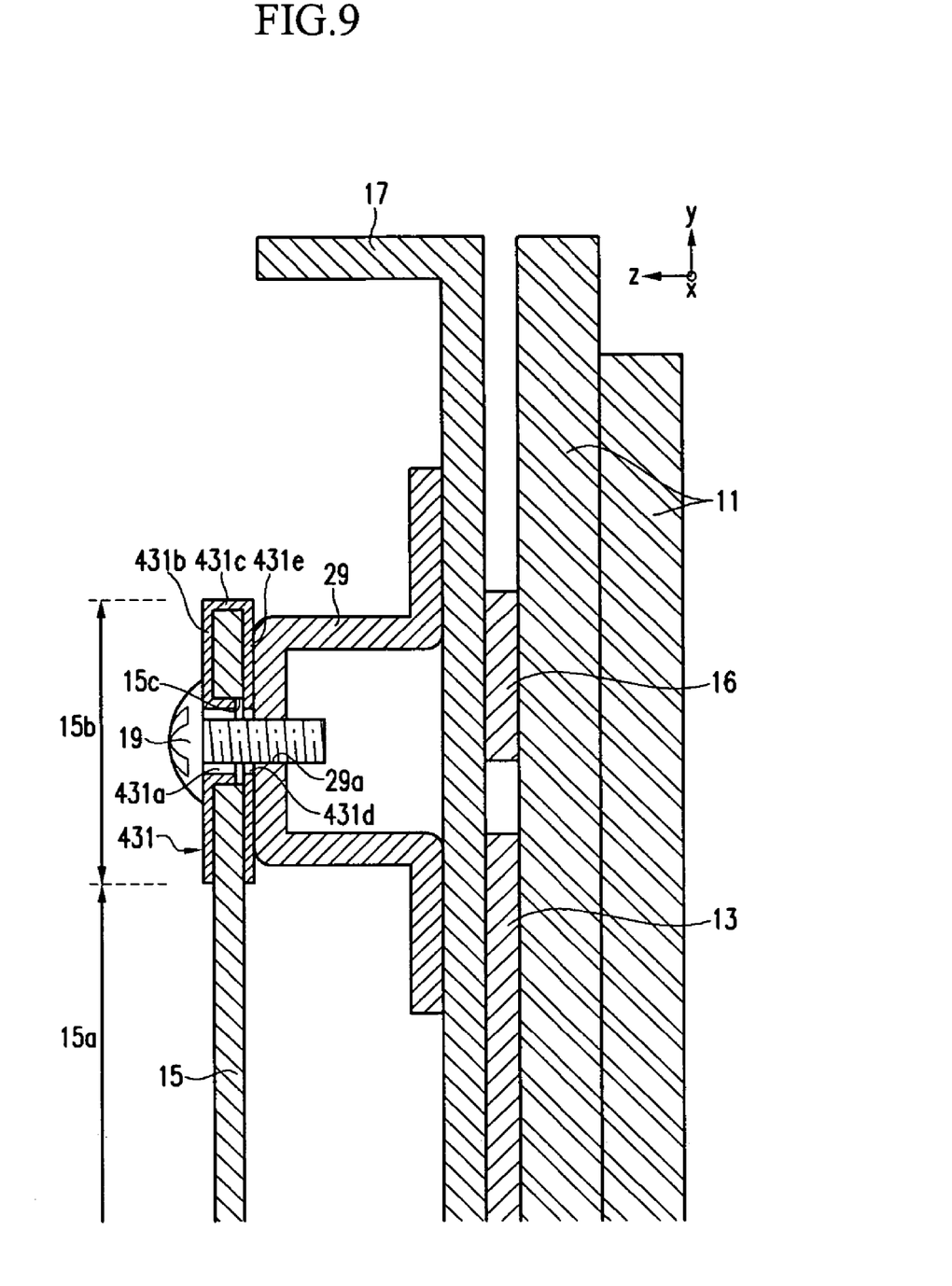
FIG. 9 illustrates a partial, sectional view of a plasma display device including the grounding module illustrated in FIG. 8, taken along a line corresponding to line II-II of FIG. 1.

FIG. 8 illustrates a perspective view of a fourth embodiment of a grounding module according to the present invention, and FIG. 9 illustrates a partial, sectional view of a plasma display device including the grounding module illustrated in FIG. 8, taken along a line corresponding to line II-II of FIG. 1. Referring to the FIGS. 8 and 9, a grounding module 431 according to a fourth embodiment of the present invention may include a circular flange 431*a*, first and second base plates 431*b* and 431*e*, and a lateral connection portion 431*c*. The circular flange 431*a* may be inserted into the fastening hole 15*c*. The first base plate 431*b* may be planarly formed around the circular flange 431*a* so as to contact the grounding section 15*b*. The lateral connection portion 431c may be formed by bending the first base plate 431b. The second base plate 431e may be formed by bending the lateral connection portion 431c such that it is parallel to the first base plate 431b. A penetration hole 431d may be provided in the second base plate 431e in correspondence with the circular flange 431a.

Fastener 19 may penetrate the circular flange 431a and the penetration hole 431d to engage with threaded hole 29a of reinforcing member 29. In this manner, the first and second base plates 431b and 431e may be electrically contacted to both sides of the grounding section 15b of the PBA 15, and the grounding section 15b of the PBA 15 may be electrically contacted with the reinforcing member 29.

FIFTH EMBODIMENT

Figure 10:
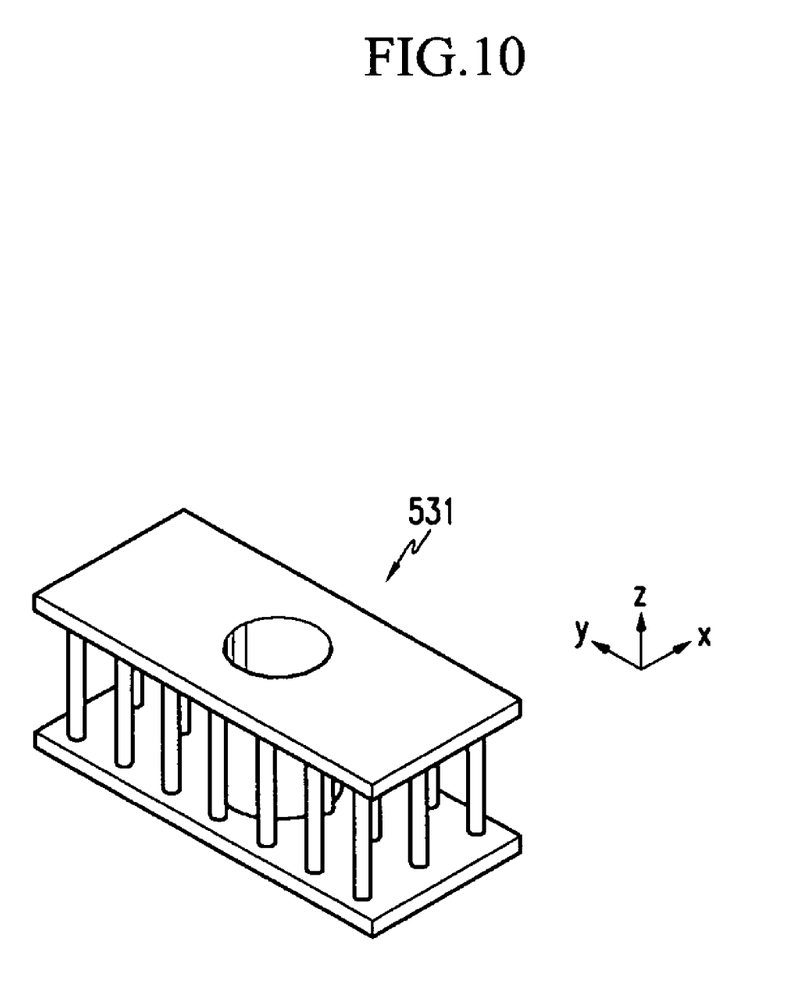
FIG. 10 illustrates a perspective view of a fifth embodiment of a grounding module according to the present invention.
Figure 11:
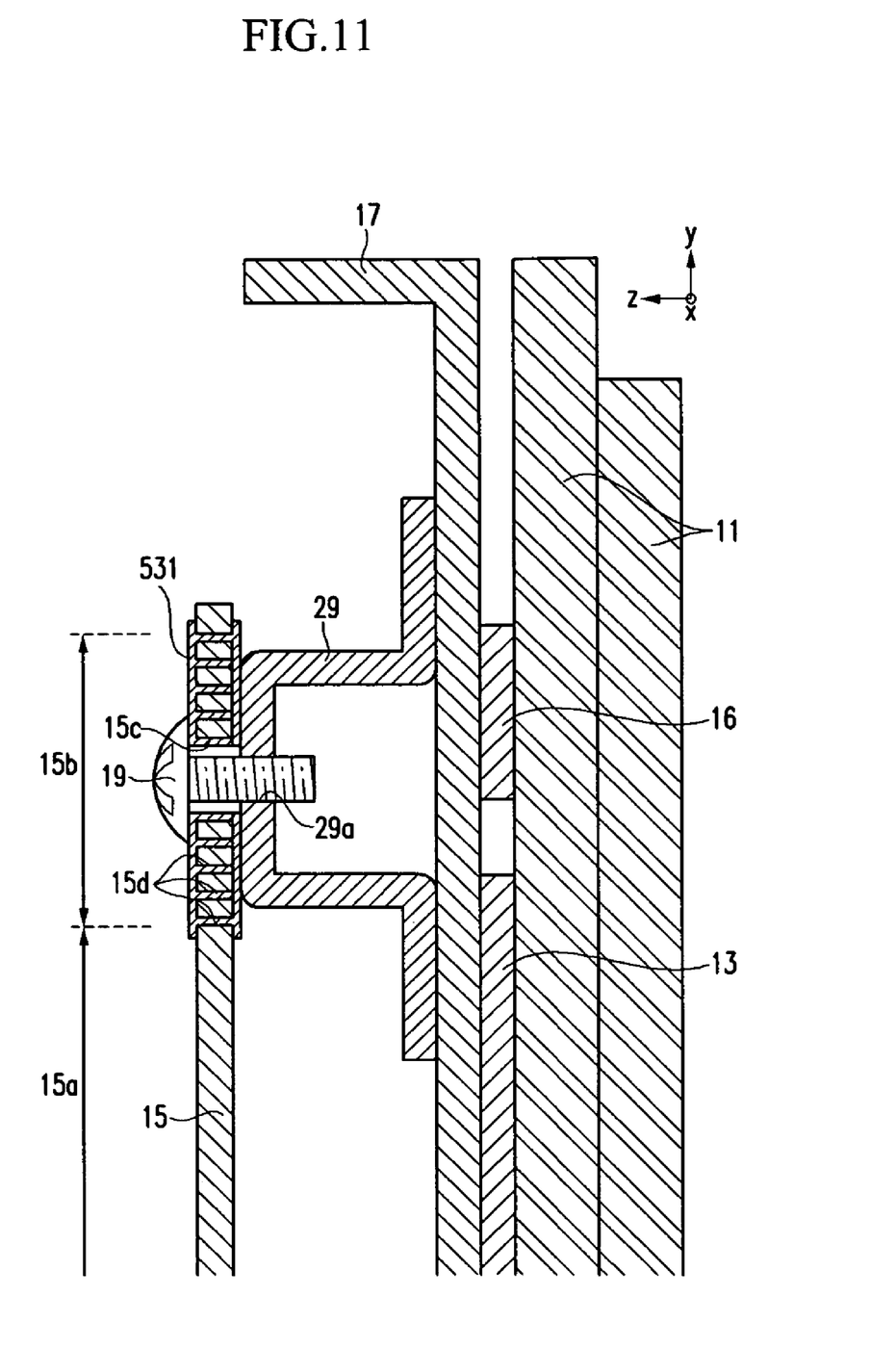
FIG. 11 illustrates a partial, sectional view of a plasma display device including the grounding module illustrated in FIG. 10, taken along a line corresponding to line II-II of FIG. 1.

FIG. 10 illustrates a perspective view of a fifth embodiment of a grounding module according to the present invention, and FIG. 11 illustrates a partial, sectional view of a plasma display device including the grounding module illustrated in FIG. 10, taken along a line corresponding to line II-II of FIG. 1. Referring to FIGS. 10 and 11, the grounding section 15b of the PBA 15 may be provided with a plurality of penetration holes 15d, and a grounding module 531 according to a fifth embodiment of the present invention may be formed as a conductive coating layer integrally formed on the surfaces of one or both sides of the grounding section 15b, the penetration holes 15d, and the fastening hole 15c. The conductive coating layer of the grounding module 531 may be formed on one or both sides of the grounding section 15b, inside the penetration holes 15d, and on the interior surface of the fastening hole 15c. The grounding section 15b may be grounded to the reinforcing member 29 by the fastening force of the fastener 19, which penetrates the fastening hole 15c and engages with the threaded hole 29a of the reinforcing member 29. The conductive coating layer may have nickel (Ni) as its main component to provide high conductivity. The conductive coating layer formed in the penetration holes 15d may have an overall shape of a brush, depending on a formed pattern of the penetration holes 15d. That is, where a plurality of penetration holes 15d is provided in the PBA 15, the conductive coating may fill the plurality of penetration holes 15d so as to form a multi-fingered structure.

According to embodiments of the present invention, the grounding modules 131, 231, 232, 331, 431, and 531 may be disposed between the PBA 15 and the reinforcing member 29, in order to strengthen the fastening force formed therebetween by the fastener 19, and, accordingly, unfastening or loosening of the fastener 19 due to impacts and vibrations may be reduced or prevented.

As described above, a plasma display device according to embodiments of the present invention may include a reinforcing member on a chassis base, and a PBA mounted on the reinforcing member by a fastener. Bosses for mounting a PBA on the chassis base may not be required, thereby simplifying the chassis base structure. Furthermore, a grounding module may be provided for a grounding section formed in the PBA. The grounding module may be positioned in an opening in the grounding section and may be disposed between the grounding section and the fastener. Accordingly, the grounding of the PBA may be enhanced and unfastening of the fastener may be reduced or prevented.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device, comprising:
   a plasma display panel mounted on a first side of a chassis base;
   a reinforcing member on a second side of the chassis base, the reinforcing member being electrically connected to the chassis base;
   a printed circuit board including an electrical grounding section and having an opening in the electrical grounding section, the printed circuit board mounted on the reinforcing member by an electrically conductive fastener passing through the opening in the electrical grounding section; and
   a grounding module positioned in the opening so as to be between the electrical grounding section and the electrically conductive fastener and electrically connecting the electrical grounding section to the reinforcing member.

2. The plasma display device as claimed in claim 1, wherein the grounding module is in contact with the reinforcing member through the opening.

3. The plasma display device as claimed in claim 1, wherein the reinforcing member includes bent ends.

4. The plasma display device as claimed in claim 1, wherein:
   the grounding module includes a plate having a flange, and
   the flange is mounted through the opening.

5. The plasma display device as claimed in claim 4, wherein:
   the printed circuit board further includes a plurality of apertures adjacent the opening, and
   the grounding module further includes a plurality of protrusions disposed at an angle to the plate and correspondingly engaged with the plurality of apertures.

6. The plasma display device as claimed in claim 5, wherein at least one of the plurality of protrusions contacts the reinforcing member through its corresponding aperture.

7. The plasma display device as claimed in claim 4, further comprising a second grounding module positioned in the opening so as to be between the printed circuit board and the reinforcing member, wherein:
   the second grounding module includes a second plate having a second flange, and
   the second flange is mounted through the opening.

8. The plasma display device as claimed in claim 7, wherein the flange and the second flange are in contact through the opening.

9. The plasma display device as claimed in claim 8, wherein:
   the printed circuit board further includes a plurality of apertures adjacent the opening, and
   each of the plate and the second plate further includes respective pluralities of protrusions disposed at an angle to the respective plates and correspondingly engaged with the plurality of apertures.

10. The plasma display device as claimed in claim 9, wherein at least one of the plurality of protrusions of the plate and at least one of the plurality of protrusions of the second plate are in contact through a corresponding aperture of the plurality of apertures.

11. The plasma display device as claimed in claim 4, wherein:
the grounding module further includes a second plate and a connecting member,
the plate and the second plate are linked by the connecting member, and
the plate is positioned on one side of the printed circuit board and the second plate is positioned on an opposite side of the printed circuit board.

12. The plasma display device as claimed in claim 11, wherein the flange and the second plate are in contact through the opening.

13. The plasma display device as claimed in claim 4, wherein:
the grounding module further includes a second plate, and
the plate and the second plate are formed at opposite ends of the flange and are disposed on opposite sides of the printed circuit board.

14. The plasma display device as claimed in claim 13, wherein the plate and the second plate are circular.

15. The plasma display device as claimed in claim 14, wherein the grounding module is formed by:
providing a grounding module blank in the opening, the grounding module blank including the circular plate and a cylindrical member, and
deforming an end of the cylindrical member to form the second plate.

16. The plasma display device as claimed in claim 13, wherein the grounding module is formed by coating a conductive material on opposite sides of the printed circuit board and in the opening.

17. The plasma display device as claimed in claim 16, wherein a main component of the conductive material is nickel.

18. The plasma display device as claimed in claim 16, wherein the conductive material is a solder paste.

19. The plasma display device as claimed in claim 16, wherein:
the printed circuit board further includes a plurality of apertures adjacent the opening,
forming the grounding module further includes coating the conductive material in the plurality of apertures, and
the plate and the second plate are joined by the flange and by a plurality of members formed by the conductive material in the plurality of apertures.

20. A plasma display device, comprising:
a plasma display panel mounted on a first side of a chassis base;
a mount on a second side of the chassis base, the mount being electrically connected to the chassis base;
a printed circuit board including an electrical grounding section and having an opening in the electrical grounding section, the printed circuit board mounted on the mount by an electrically conductive fastener passing through the opening in the electrical grounding section, the printed circuit board further including a plurality of apertures adjacent the opening; and
a grounding module positioned in the opening so as to be between the electrical grounding section and the electrically conductive fastener and electrically connecting the electrical grounding section to the mount, the grounding module including a plate having a flange, the flange mounted through the opening, the grounding module further including a plurality of protrusions disposed at an angle to the plate and correspondingly engaged with the plurality of apertures.

21. A plasma display device, comprising:
a plasma display panel mounted on a first side of a chassis base;
a mount on a second side of the chassis base, the mount being electrically connected to the chassis base;
a printed circuit board including an electrical grounding section and having an opening in the electrical grounding section, the printed circuit board mounted on the mount by an electrically conductive fastener passing through the opening in the electrical grounding section;
a grounding module positioned in the opening so as to be between the electrical grounding section and the electrically conductive fastener and electrically connecting the electrical grounding section to the mount, wherein the grounding module includes a plate having a flange, and the flange is mounted through the opening; and
a second grounding module positioned in the opening so as to be between the printed circuit board and the mount, wherein the second grounding module includes a second plate having a second flange, and the second flange is mounted through the opening.

\* \* \* \* \*